(12) United States Patent
Rangarajan et al.

(10) Patent No.: US 6,641,963 B1
(45) Date of Patent: Nov. 4, 2003

(54) SYSTEM AND METHOD FOR IN SITU CONTROL OF POST EXPOSURE BAKE TIME AND TEMPERATURE

(75) Inventors: Bharath Rangarajan, Santa Clara, CA (US); Michael K. Templeton, Atherton, CA (US); Bhanwar Singh, Morgan Hill, CA (US); Ramkumar Subramanian, Sunnyvale, CA (US)

(73) Assignee: Advanced Micro Devices, INC, Sunnyvale, CA (US)

( * ) Notice: Subject to any disclaimer, the term of this patent is extended or adjusted under 35 U.S.C. 154(b) by 27 days.

(21) Appl. No.: 09/845,239

(22) Filed: Apr. 30, 2001

(51) Int. Cl.$^7$ .............................. G03F 9/00; G03B 27/52
(52) U.S. Cl. ......................... 430/30; 355/30; 430/330; 432/37
(58) Field of Search ............................. 355/30; 432/37; 430/30, 330

(56) References Cited

U.S. PATENT DOCUMENTS 6,377,334 B2 * 4/2002 Whiting .................. 355/55

* cited by examiner

Primary Examiner—Christopher G. Young
(74) Attorney, Agent, or Firm—Amin & Turocy, LLP

(57) ABSTRACT

A system for regulating temperature of a post exposure baking process is provided. The system includes one or more light sources, each light source directing light to one or more gratings being baked and hardened on a wafer. Light reflected from the gratings is collected by a measuring system, which processes the collected light. Light passing through the gratings may similarly be collected by the measuring system, which processes the collected light. The collected light is indicative of the baking and hardening of the respective portions of the wafer. The measuring system provides baking and hardening related data to a processor that determines the baking and hardening of the respective portions of the wafer. The system also includes a plurality of temperature controlling devices, each such device corresponds to a respective portion of the wafer and provides for the heating and/or cooling thereof. The processor selectively controls the temperature controlling devices so as to regulate temperature of the respective portions of the wafer.

11 Claims, 14 Drawing Sheets

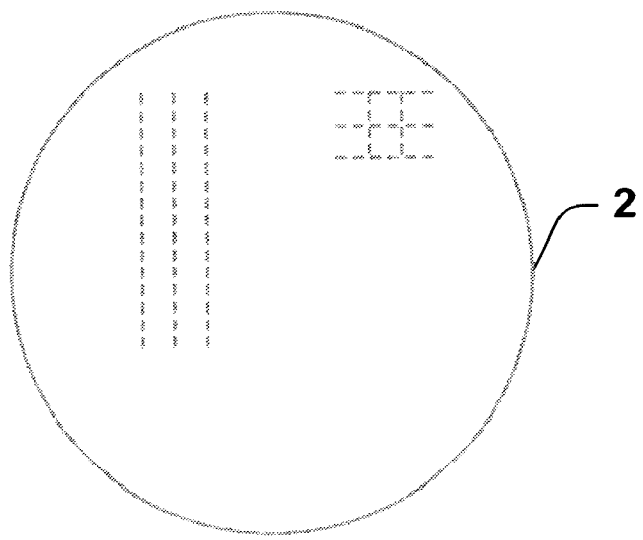
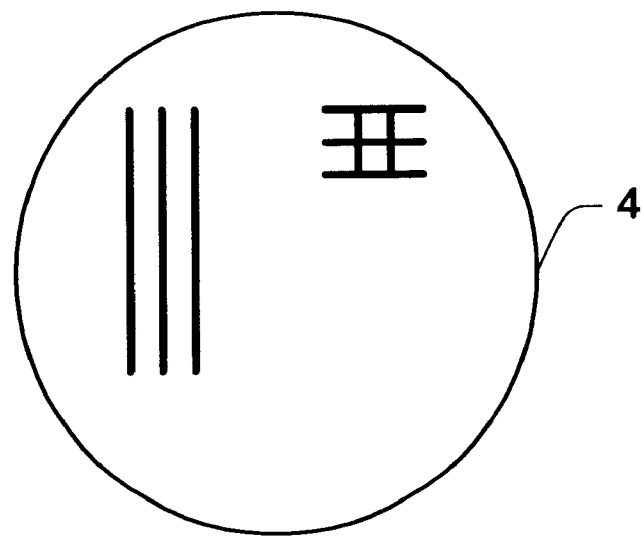
Fig. 1

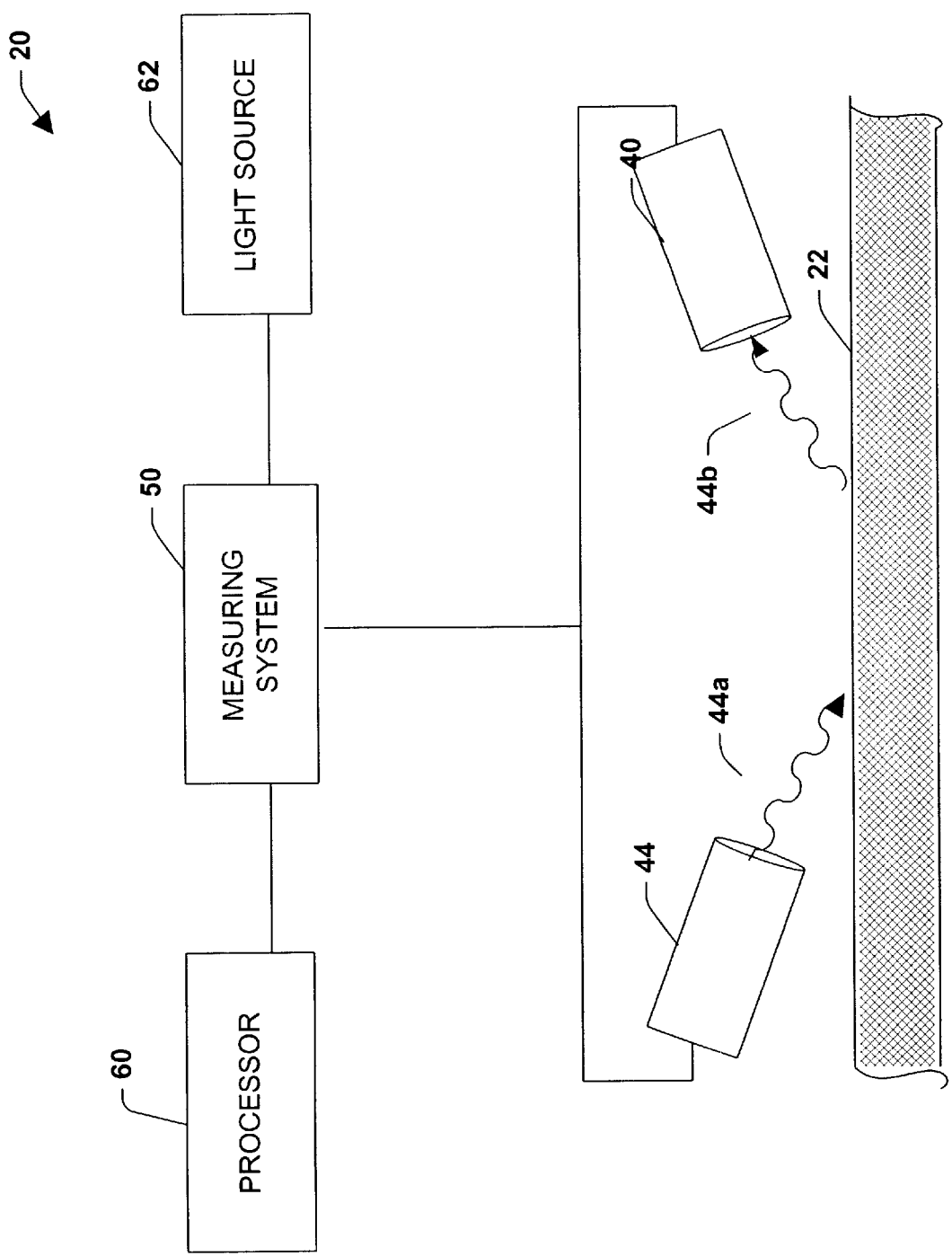

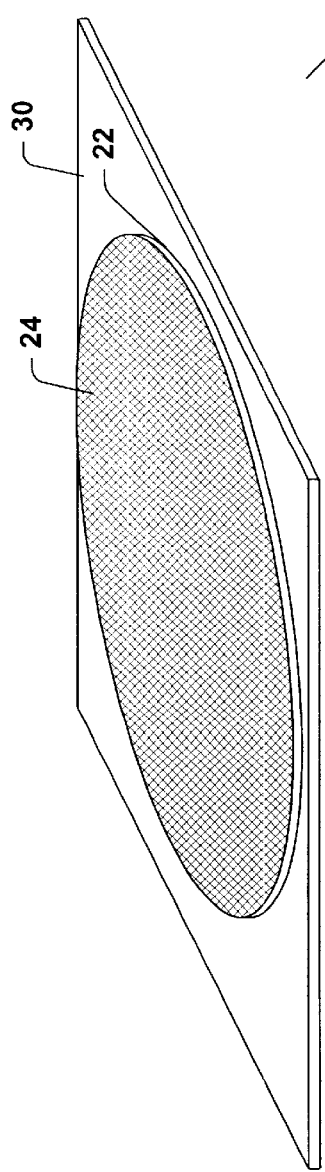
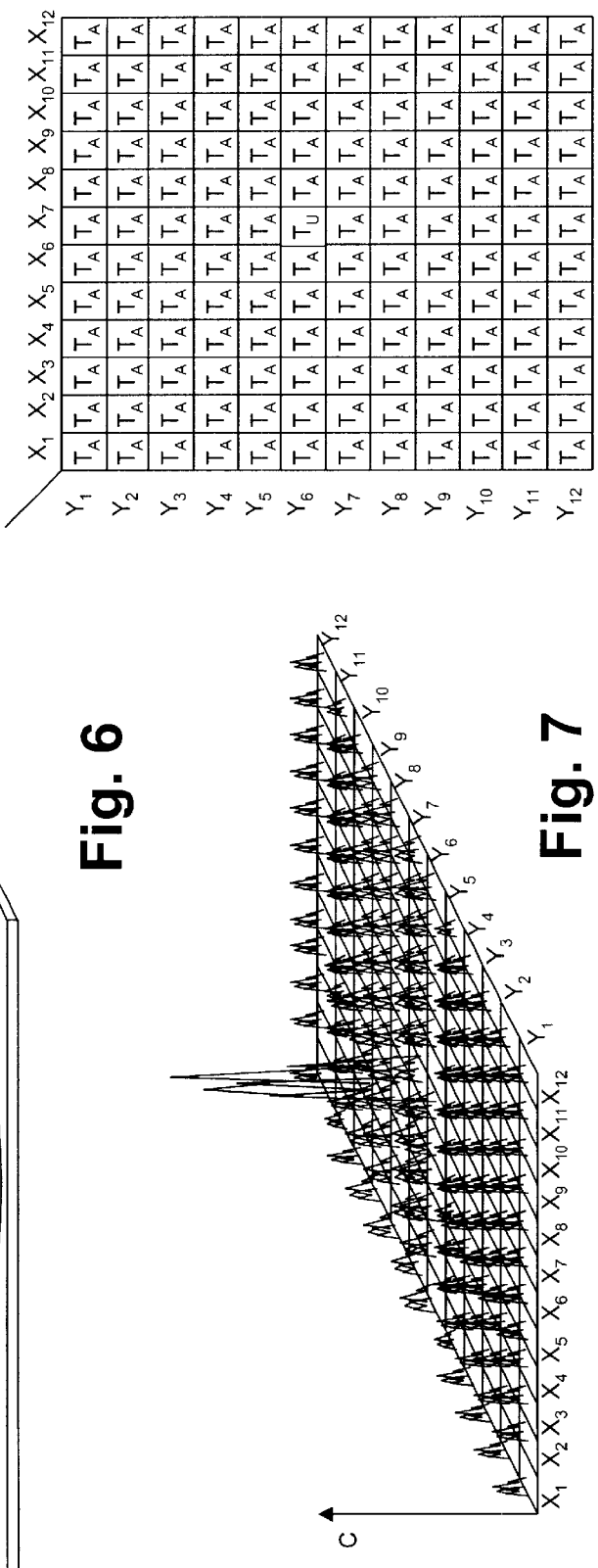

SYSTEM AND METHOD FOR IN SITU CONTROL OF POST EXPOSURE BAKE TIME AND TEMPERATURE

TECHNICAL FIELD

The present invention generally relates to semiconductor processing, and in particular to a system for regulating post exposure bake time and temperature.

BACKGROUND

The process of manufacturing semiconductors, or integrated circuits (commonly called ICs, or chips), typically consists of more than a hundred steps, during which hundreds of copies of an integrated circuit may be formed on a single wafer. One such step is referred to as a post exposure bake step, which follows a masking step.

The masking step is used to protect one area of the wafer while working on another area. This process is referred to as photolithography or photo-masking. A photo resist, or light-sensitive film, is applied to the wafer, giving it characteristics similar to a piece of photographic paper. Depending on the resist system, post exposure baking may be employed to reduce standing wave effects and/or to thermally catalyze chemical reactions that amplify a latent image. Post exposure baking has been shown to increase linewidth control and resolution. Conventionally, post exposure baking times and/or temperatures have been pre-calculated and/or based on indirect measurements (e.g., concentration of chemicals in vapor retrieved from post exposure bake chamber). Such pre-calculated control parameters and/or indirect measurements may not, therefore, account for wafer to wafer variations, variations within a wafer and/or apparatus idiosyncrasies, for example.

In an etching step, the wafer is then "developed" (the exposed photo resist is removed) and baked to harden the remaining photo resist pattern. The temperature at which the wafer is baked, and the period of time for which it is baked affect the critical dimensions of the wafer. The wafer is then exposed to a chemical solution or plasma (gas discharge) so that areas not covered by the hardened photo resist are etched away. The photo resist is removed using additional chemicals or plasma and the wafer is then inspected to ensure the image transfer from the mask to the top layer is correct.

Due to the extremely fine patterns that are exposed on the photo resist, controlling the post exposure bake temperature and the time period over which one or more temperatures are applied during the post exposure bake are significant factors in achieving desired critical dimensions. It has been demonstrated that the post-exposure bake step is important in IC manufacture since it can be employed to activate chemical reactions that catalyze the amplification of an initial UV-light induced latent image. Within-wafer and/or wafer-to-wafer variations during post-exposure bake will contribute significantly to linewidth variation. Thus, maintaining the post exposure bake at a desired temperature, for a desired period of time, may enable uniformity in photo resist hardening and increase the quality of the underlying integrated circuit being manufactured. Small changes in the time and temperature history of the post exposure bake can substantially alter photo resist hardening, resulting in lack of image line control. For example, a few degrees temperature difference and/or an overly long or short post exposure bake time can drastically affect critical dimensions.

To keep processing times under control, sensitive photo resists are employed. A typical highly sensitive photo resist is a chemically amplified photo resist. A chemically amplified photo resist is one in which exposure to actinic radiation produces a catalyst for a reaction that alters the solubility of the resist. A common example is a positive tone resist containing a photo acid generator that generates an acid catalyst on exposure to actinic radiation. The photo-generated acid may catalyze a deprotection reaction that increases the solubility of the photo resist in an aqueous base.

A post exposure baking (PEB) step can be employed to cause the photo-generated catalyst to diffuse and react within the photo resist coating. The PEB step has a significant effect on the quality of pattern transfer. If the PEB step is too long, or if the resist is overheated, then the catalyst can migrate outside of the exposed portion of the resist into surrounding unexposed areas. If the PEB step is too short or the resist is under heated, diffusion and reaction of the catalyst may be unduly limited resulting in an inadequate solubility contrast between exposed and unexposed regions of the photo resist. Time and temperature are related in the post exposure bake process. For example, higher temperatures may cause faster baking and subsequently faster hardening, while lower temperatures may cause slower baking and correspondingly slower hardening. Ideally, all portions of a wafer would bake and harden at precisely the same rate when subjected to identical temperatures for identical times. Unfortunately, such uniform baking and hardening does not always occur, with different wafer portions baking and hardening at different rates. For example, the center of a wafer may bake and harden at a different rate than the edge of a wafer. Thus, an efficient system and/or method to monitor the post exposure bake and hardening process, and to control post exposure baking time and temperature, is desired to increase fidelity in image transfer.

SUMMARY

The following presents a simplified summary of the invention in order to provide a basic understanding of some aspects of the invention. This summary is not an extensive overview of the invention. It is not intended to identify key/critical elements of the invention or to delineate the scope of the invention. Its sole purpose is to present some concepts of the invention in a simplified form as a prelude to the more detailed description that is presented later.

The present invention provides a system that facilitates controlling post exposure baking temperature and the time over which post-exposure baking temperatures are applied. An exemplary system may employ one or more light sources arranged to project light onto one or more lines and/or gratings on a wafer and one or more light sensing devices (e.g., photo detector, photodiode) for detecting light reflected by, and/or allowed to pass through, the one or more lines and/or gratings. The light reflected from, and/or passing through, the one or more gratings is indicative of at least one parameter of the post exposure bake process (e.g., percent completion of hardening, desired critical dimensions) that may vary in correlation with post exposure baking time and temperature.

In conventional systems, heating and chilling apparatus may be employed to control the temperature within a post exposure bake chamber. But such conventional systems may only monitor the temperature in the chamber and/or of the wafer as a whole, with such temperatures being employed in evaluating adherence to pre-calculated times and temperatures. The present invention provides for one or more temperature controlling components arranged to correspond to a particular wafer portion. The temperature controlling components may be, for example, heat lamps, baking plates, and/or fluid conducting apparatus. It is to be appreciated by one skilled in the art that any suitable temperature controlling component can be employed with the present invention. Each temperature controlling component may be responsible for heating and/or cooling one or more particular wafer portions. The temperature controlling components are selectively driven by the system to produce temperatures on a wafer portion at a desired level for a desired time based on data collected from in situ linewidth and/or grating measurements being employed to produce feedback information operable to control the temperature controlling components. The baking and hardening progress is monitored by the system by comparing the size and/or shape of the lines and/or gratings on the wafer to desired size and/or shapes. As a result, more optimal baking and hardening is achieved by controlling the temperatures applied to the portions of the wafer by feedback generated from direct measurements, which in turn increases fidelity of image transfer.

One particular aspect of the invention relates to a system for regulating post exposure baking time and temperature. At least one temperature controlling component operates to heat and/or cool a portion of a wafer, and a temperature controlling component driving system drives the at least one temperature controlling component. A system for directing light directs light to one or more lines and/or gratings being baked and hardened on the wafer, and a measuring system measures critical dimensions of the one or more lines and/or gratings based on light reflected, and/or passed through, the lines and/or gratings. A processor is operatively coupled to the measuring system and a temperature controlling component driving system. The processor receives critical dimension data from the measuring system, and the processor uses the data to at least partially base control of the at least one temperature controlling component so as to regulate temperature of the at least one portion of the wafer being developed.

Another aspect of the present invention relates to a method for regulating post exposure baking temperature. The method includes defining a wafer as one or more portions and baking and hardening one or more lines and/or gratings on a wafer. While the lines and/or gratings are being baked and hardened, the method involves directing light onto at least one of the lines and/or gratings, collecting light reflected by and/or passed through the at least one grating and analyzing the reflected and/or passed through light to determine the progress of baking and hardening of the wafer and the acceptability of the critical dimensions being achieved. The method further includes generating feedback information that can be employed to control a temperature controlling component to regulate the temperature of the at least one portion.

To the accomplishment of the foregoing and related ends, the invention, then, comprises the features hereinafter fully described and particularly pointed out in the claims. The following description and the annexed drawings set forth in detail certain illustrative embodiments of the invention. These embodiments are indicative, however, of but a few of the various ways in which the principles of the invention may be employed. Other objects, advantages and novel features of the invention will become apparent from the following detailed description of the invention when considered in conjunction with the drawings.

BRIEF DESCRIPTION OF THE INVENTIONS

FIG. 1 is a top view of a wafer exposed with lines and gratings at two different points in time in the post-exposure baking process.

FIG. 5 is a partial schematic block diagram of the system of FIG. 4 being employed in connection with determining the progress of post-exposure baking by measuring line and/or grating size and/or shape in accordance with the present invention.

FIG. 6 is a partial schematic block diagram of the system of FIG. 4 being employed in connection with determining the progress of post-exposure baking by measuring grating size and/or shape in accordance with the present invention.

FIG. 6 is a perspective illustration of a photo resist having a line and/or grating formed thereon in accordance with the present invention.

FIG. 7 is a representative three-dimensional grid map of a wafer illustrating post-exposure baking progress measurements taken at grid blocks of the grid map in accordance with the present invention.

FIG. 8 is a post-exposure baking progress measurement table correlating the post-exposure baking progress measurements of FIG. 7 with desired values for the post-exposure baking progress measurements in accordance with the present invention.

FIG. 11 is a simplified perspective view of an incident light reflecting off a surface, in accordance with an aspect of the present invention.

DETAILED DESCRIPTION

Figure 2:
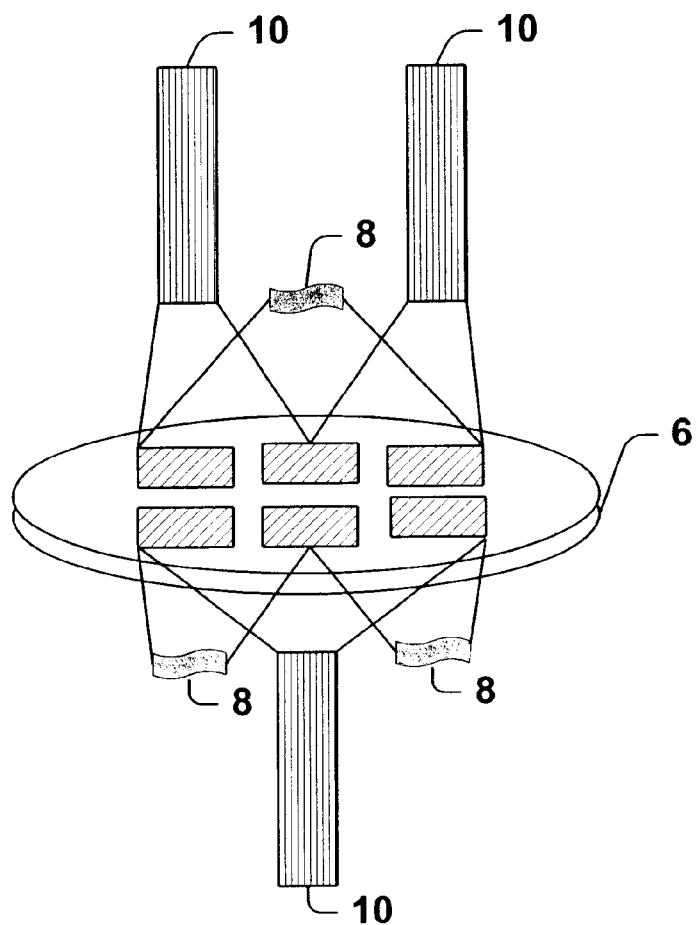
FIG. 2 is a schematic block diagram illustrating a wafer having its temperature controlled by heaters and/or chillers, in accordance with an aspect of the present invention.

The present invention is now described with reference to the drawings, wherein like reference numerals are used to refer to like elements throughout. In the following description, for purposes of explanation, numerous specific details are set forth in order to provide a thorough understanding of the present invention. It may be evident, however, to one skilled in the art that the present invention may be practiced without these specific details. In other instances, well-known structures and devices are shown in block diagram form in order to facilitate description of the present invention.

It is to be appreciated that various aspects of the present invention may employ technologies associated with facilitating unconstrained optimization and/or minimization of error costs. Thus, non-linear training systems/methodologies (e.g., back propagation, Bayesian, fuzzy sets, non-linear regression, or other neural networking paradigms including mixture of experts, cerebella model arithmetic computer (CMACS), radial basis functions, directed search networks and function link networks) may be employed.

Referring initially to FIG. 1, a wafer 2 and a wafer 4 are illustrated. The wafer 2 represents a wafer that has lines and a grating exposed thereon, and which has been exposed to a first post-exposure baking process, while the wafer 4 represents a wafer that has lines and a grating exposed thereon, and which has been exposed to a second post-exposure baking process. By way of illustration, the first baking process may have involved heating the wafer 2 at a first rate, to a first desired temperature, for a first period of time, while the second baking process may have involved heating the wafer 4 at a second rate, to a second desired temperature, for a second period of time. Additionally, the wafer 4 may represent the wafer 2, at a later point in time in the first baking process. For example, the wafer 4 may have been heated at the first rate, to the first desired temperature, but may have remained at that first desired temperature for a longer period of time. The difference in the brightness, sharpness, color and shape of the lines on the pattern exposed on the wafer 2 and the wafer 4 represent, in an illustrative manner, the effect of time and temperature on the post-exposure baking process.

The present invention facilitates examining lines and/or gratings exposed on a wafer and thus facilitates acquiring data that can be employed to evaluate critical 30 dimensions associated with the progress of the post-exposure baking process (e.g., line size, shape, sharpness). By way of illustration, the present invention may be employed in situ in examining and evaluating the lines and/or grating on the wafer 2, and in generating feedback information that can be employed to control the post-exposure baking process. For example, after examining and evaluating the lines and/or grating on the wafer 2, the present invention may generate feedback information to increase the temperature at which the wafer 2 is being baked, and may also generate feedback information to shorten the period of time for which the wafer 2 should be baked. By way of further illustration, the present invention may be employed in situ in examining and evaluating the lines and/or grating on the wafer 4 (which may be the wafer 2 at a later point in time), and in generating feedback information that can be employed to control the post-exposure baking process. For example, after examining and evaluating the lines and/or grating on the wafer 4, the present invention may generate feedback information to conclude the post-exposure baking process. Thus, by facilitating in situ measurement and analysis, and by facilitating generating feedback information that can be employed in controlling post-exposure baking processes, the present invention provides advantages over conventional systems.

Turning now to FIG. 2, a wafer 6 that is having its temperature controlled is illustrated. While one heating method and one chilling method are illustrated in FIG. 2, it is to be appreciated that any suitable controllable heating and/or chilling methods and/or apparatus may be employed in accordance with the present invention. The wafer 6 is illustrated as being heated by a plurality of heating coils 8 that are illustrated arranged above and below the wafer 6, with each heating coil 8 producing heat that is transmitted to a localized portion of the wafer 6. It is to be appreciated that while three heating coils 8 are illustrated, that a greater or lesser number of heating coils 8 may be employed in accordance with the present invention. Similarly, while heating coils 8 are illustrated above and below the wafer 6, it is to be appreciated that the coils 8 may be located at any suitable location in relation to the wafer 6, in accordance with the present invention. The wafer 6 is also being chilled by a plurality of chilling components 10 that are illustrated arranged above and below the wafer 6, with each chilling component 10 producing chilling effects that are transmitted to a localized portion of the wafer 6. It is to be appreciated that while three chilling components 10 are illustrated, that a greater or lesser number of chilling components 10 may be employed in accordance with the present invention. Similarly, while chilling components 10 are illustrated above and below the wafer 6, it is to be appreciated that the chilling components 10 may be located at any suitable location in relation to the wafer 6, in accordance with the present invention.

The present invention facilitates generating feedback information that can be employed to control temperature controlling devices (e.g., heating coils 8, chilling components 10), to facilitate more precise control of post-exposure baking processes. By way of illustration, feedback information may be generated that indicates that a first heater should increase the amount of heat it is producing, while a second and third heater should maintain the amount of heat being produced, while a fourth and fifth chiller should reduce the amount of heat being applied to a wafer portion. Such control facilitates producing more uniformly baked wafers, which can in turn increase chip yield and quality.

Figure 3:
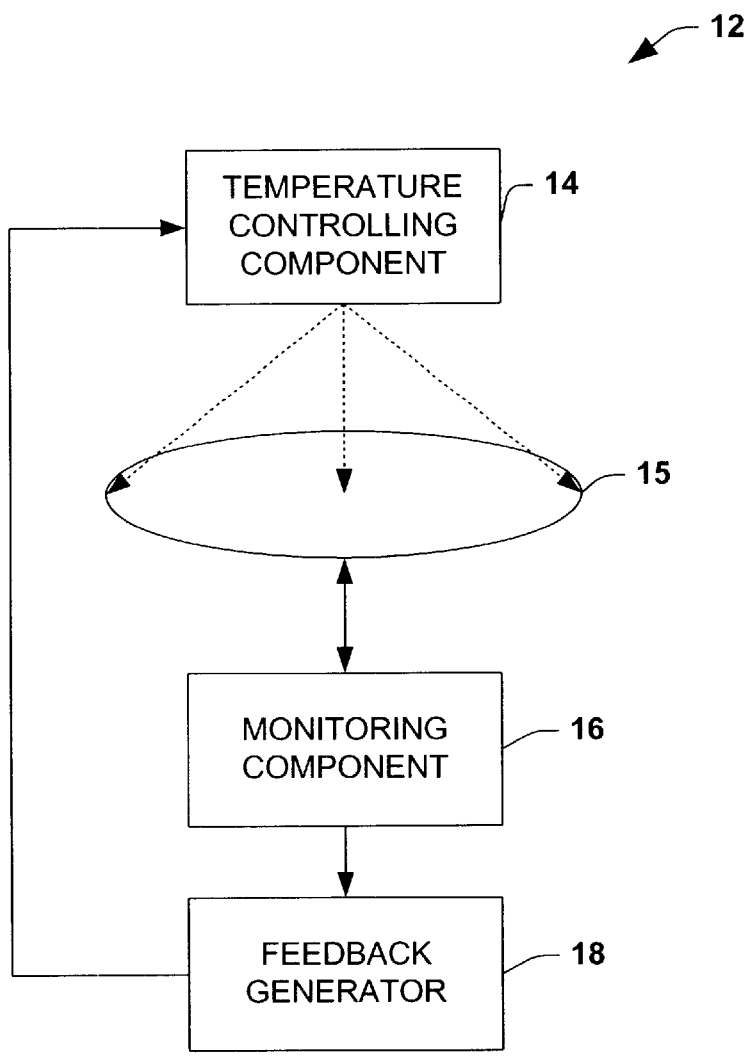
FIG. 3 is a schematic block diagram illustrating a system for controlling wafer temperature during a post-exposure baking process, in accordance with an aspect of the present invention.

Referring Now to FIG. 3, a system 12 for controlling post-exposure baking time and/or temperature is illustrated. The system 12 includes one or more temperature controlling components 14 (e.g., heaters, chillers) that can be employed to control the post-exposure bake temperature for a wafer 15. The present invention may employ a plurality of such temperature controlling components 14, each of which may be operable to control the temperature on a portion of the wafer 15. The system 12 includes a monitoring component 16 that can be employed to acquire in situ data concerning critical dimensions of lines and/or gratings on the wafer 15. The monitoring component 16 can deliver such in situ data to a feedback component 18, where the feedback component 18 is adapted to produce feedback information that can be employed to control the temperature controlling components 14.

Figure 4:
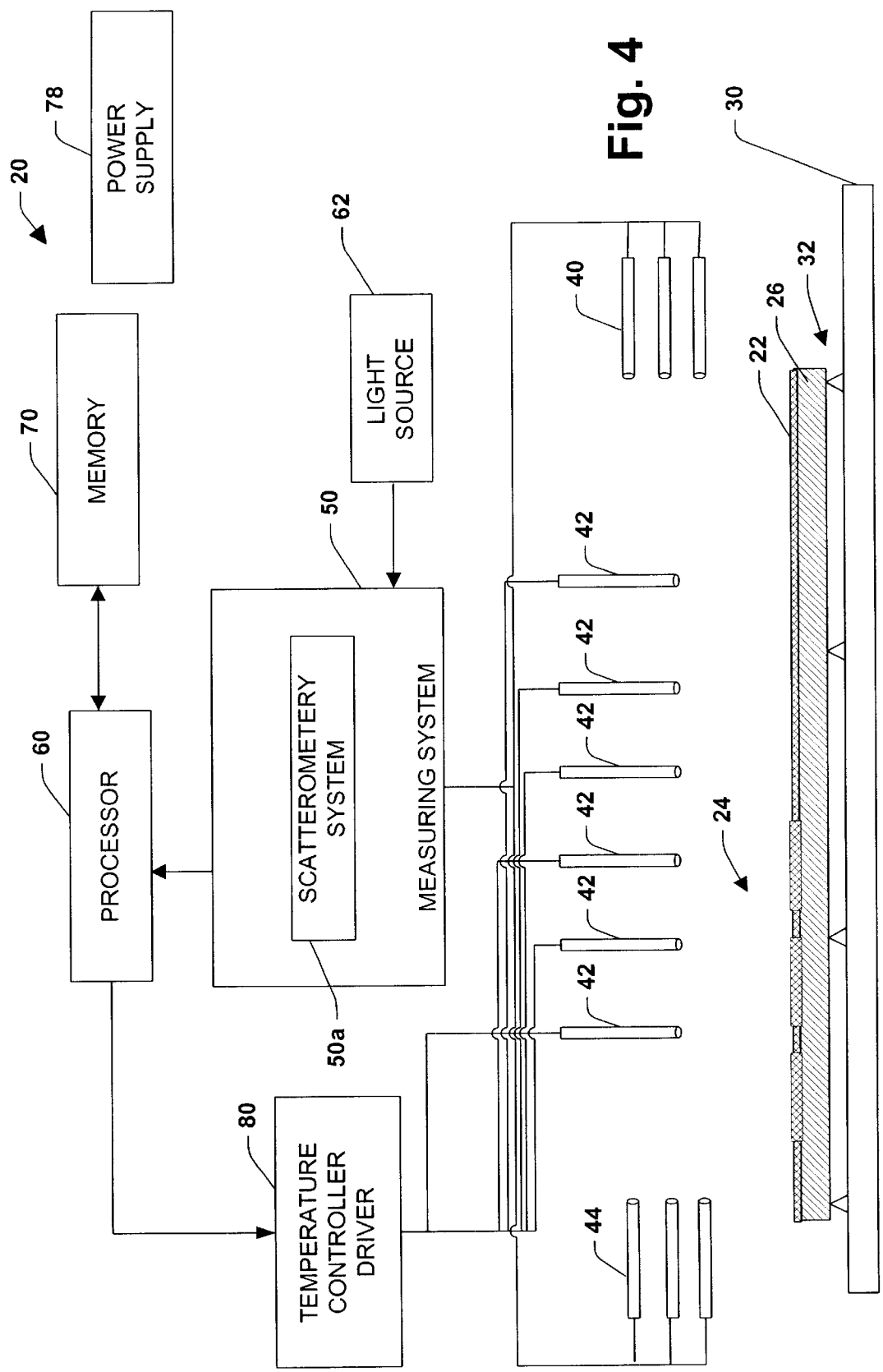
FIG. 4 is schematic block diagram of a post-exposure baking temperature monitoring and controlling system in accordance with the present invention.

Referring now to FIG. 4, a system 20 for controlling post-exposure baking temperature of a wafer 22 is shown. One or more lines and/or gratings 24 may be exposed on the wafer 22. The system 20 includes one or more temperature controlling components 42 (e.g., heaters, chillers) that are selectively controlled by the system 20 so as to facilitate controlled heating and/or chilling of the wafer 22. One or more light sources 44 project light onto respective portions of the wafer 22. A portion may have one or more lines and/or gratings 24 being developed on that portion. Light reflected and/or passed through the one or more lines and/or gratings 24 is collected by one or more light detecting components 40 and processed by a grating parameter measuring system 50 to measure at least one parameter relating to the post-exposure baking of the wafer 22. The reflected and/or passed through light is processed with respect to the incident light in measuring the various parameters. While the discussion of scatterometry signature generation is primarily undertaken in the context of the one or more gratings 24, it is to be appreciated that other patterns may also be employed in accordance with the present invention.

The measuring system 50 includes a scatterometry system 50a. It is to be appreciated that any suitable scatterometry system may be employed to carry out the present invention and such systems are intended to fall within the scope of the appended claims.

A source of light 62 (e.g., a laser) provides light to the one or more light sources 44 via the measuring system 50. Preferably, the light source 62 is a frequency stabilized laser however it will be appreciated that any laser or other light source (e.g., laser diode or helium neon (HeNe) gas laser) suitable for carrying out the present invention can be employed. One or more light detecting components 40 (e.g., photo detector, photo diodes) collect light reflected from or passed through the one or more gratings 24.

A processor 60 receives the measured data from the measuring system 50 and determines the progress of post-exposure baking of the respective portions of the wafer 22. The processor 60 is operatively coupled to the measuring system 50 and is programmed to control and operate the various components within the temperature controlling system 20 in order to carry out the various functions described herein. The processor, or CPU 60, may be any of a plurality of processors, such as the AMD K7 and other similar and compatible processors. The manner in which the processor 60 can be programmed to carry out the functions relating to the present invention will be readily apparent to those having ordinary skill in the art based on the description provided herein. A memory 70, which is operatively coupled to the processor 60, is also included in the system 20 and serves to store program code executed by the processor 60 for carrying out operating functions of the system 20 as described herein. The memory 70 also serves as a storage medium for temporarily storing information such as post-exposure bake temperature, temperature tables, coordinate tables, grating sizes, grating shapes, scatterometry information, and other data that may be employed in carrying out the present invention.

A power supply 78 provides operating power to the system 20. Any suitable power supply (e.g., battery, line power) may be employed to carry out the present invention. The processor 60 is also coupled to a temperature controlling driving system 80 that drives the temperature controlling components 42. The temperature controlling driving system 80 is controlled by the processor 60 to selectively vary output of the respective temperature controlling components 42. Each respective portion of the wafer 22 is associated with a corresponding temperature controlling component 42. The temperature controlling components 42 can be apparatus including, but not limited to, heaters and chillers. The processor 60 monitors the critical dimensions of the one or more lines and/or gratings 24 and selectively regulates the temperatures of each portion via corresponding temperature controlling components 42. As a result, the system 20 provides for regulating temperature of the wafer 22, which in turn improves fidelity of image transfer in a lithographic process and produces higher IC yield and quality.

FIG. 5 illustrates the system 20 being employed to measure the effect of post-exposure baking of a particular portion of the wafer 22. The temperature of the wafer 22 and/or the atmosphere near the wafer 22 will have an impact on the critical dimensions of lines exposed on the wafer 22. The light source 44 directs a light 44a incident to the surface of the wafer 22. The reflected light 44a from the surface of the wafer 22 will vary (e.g., variations in intensity and/or phase) in accordance with the effects of the post-exposure baking on the lines and/or grating on the wafer 22. The one or more light detecting components 40 collect the reflected light 44b, pass the collected light and/or data concerning the collected light to the measuring system 50, which processes the reflected light 44b and/or data concerning the reflected light 44b in accordance with any of a variety of suitable techniques (e.g., scatterometry, spectroscopic ellipsometry) to provide the processor 60 with data corresponding to the effects of the post-exposure baking on the wafer 22.

Turning now to FIGS. 6–8 a chuck 30 is shown in perspective supporting a wafer 22 whereupon one or more lines and/or gratings 24 may have been exposed and are being baked. The system 20 for controlling post-exposure baking temperature provides for regulating the time and/or temperature of the post-exposure baking process. The wafer 22 may be divided into a grid pattern as that shown in FIG. 7. Each grid block (XY) of the grid pattern corresponds to a particular portion of the wafer 22 and each grid block may have one or more gratings associated with that grid block. Each portion can be individually monitored for the effects of post-exposure baking and each portion may be individually controlled for temperature.

In FIG. 7, one or more gratings 24 in the respective portions of the wafer 22 ($X_1Y_1 \ldots X_{12}, Y_{12}$) are being monitored for the effects of post-exposure baking using reflective and/or passed through light, the measuring system 50 and the processor 60. Critical dimensions associated with each grating 24 are shown. As can be seen, the critical dimensions at coordinate $X_7Y_6$ are substantially higher than the critical dimensions of the other portions XY. It is to be appreciated that although FIG. 7 illustrates the wafer 22 being mapped (partitioned) into 144 grid block portions, the wafer 22 may be mapped with any suitable number of portions and any suitable number of gratings 24 may be employed. Although the present invention is described with respect to one temperature controlling component 42 corresponding to one grid block XY, it is to be appreciated that any suitable number of temperature controlling components 42 corresponding to any suitable number of wafer 22 portions may be employed.

FIG. 8 is a representative table of critical dimension measurements taken for the various grid blocks that have been correlated with acceptable critical dimension values for the portions of the wafer 22 mapped by the respective grid blocks. As can be seen, all the grid blocks, except grid block $X_7Y_6$, have critical dimension measurements corresponding to an acceptable critical dimension value ($T_A$) (e.g., are within an expected range of critical dimensions), while grid block $X_7Y_6$ has an undesired critical dimensions value ($T_U$). Thus, the processor 60 has determined that an undesirable critical dimension exists at the portion of the wafer 22 mapped by grid block $X_7Y_6$. Accordingly, the processor 60 can drive one or more temperature controlling components (e.g., temperature controlling component $42_{7,6}$) which can affect the temperature of the portion of the wafer 22 mapped at grid block $X_7Y_6$, to bring the temperature of this portion of the wafer 22 to a level more likely to produce a desired critical dimension. It is to be appreciated that the temperature controlling components 42 may be driven so as to maintain, increase and/or decrease the temperature of the respective wafer 22 portions as desired.

Figure 9:
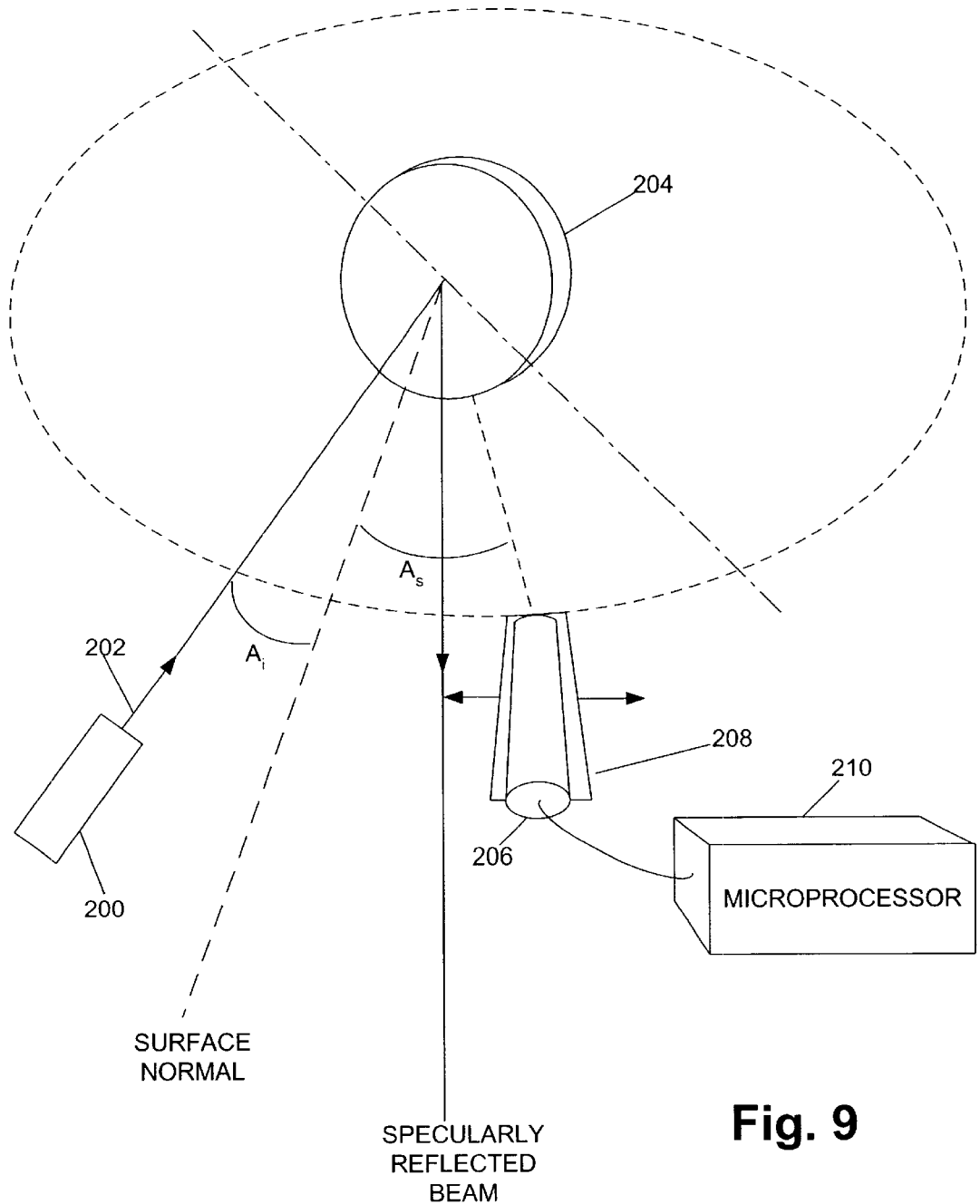
FIG. 9 illustrates an exemplary scatterometry system collecting reflected light.

FIG. 9 illustrates an exemplary scatterometry system collecting reflected light. Light from a laser 200 is brought to focus in any suitable well-known manner to form a beam 202. A sample, such as a wafer 204 is placed in the path of the beam 202 and a photo detector or photo multiplier 206 of any suitable well-known construction. Different detector methods may be employed to determine the scattered power. To obtain a grating pitch, the photo detector or photo multiplier 206 may be mounted on a rotation stage 208 of any suitable well-known design. A microprocessor 210, of any suitable well-known design, may be used to process detector readouts, including but not limited to angular locations of different diffracted orders leading to diffraction grating pitches being calculated. Thus, light reflected from the sample 204 may be accurately measured.

Figure 10:
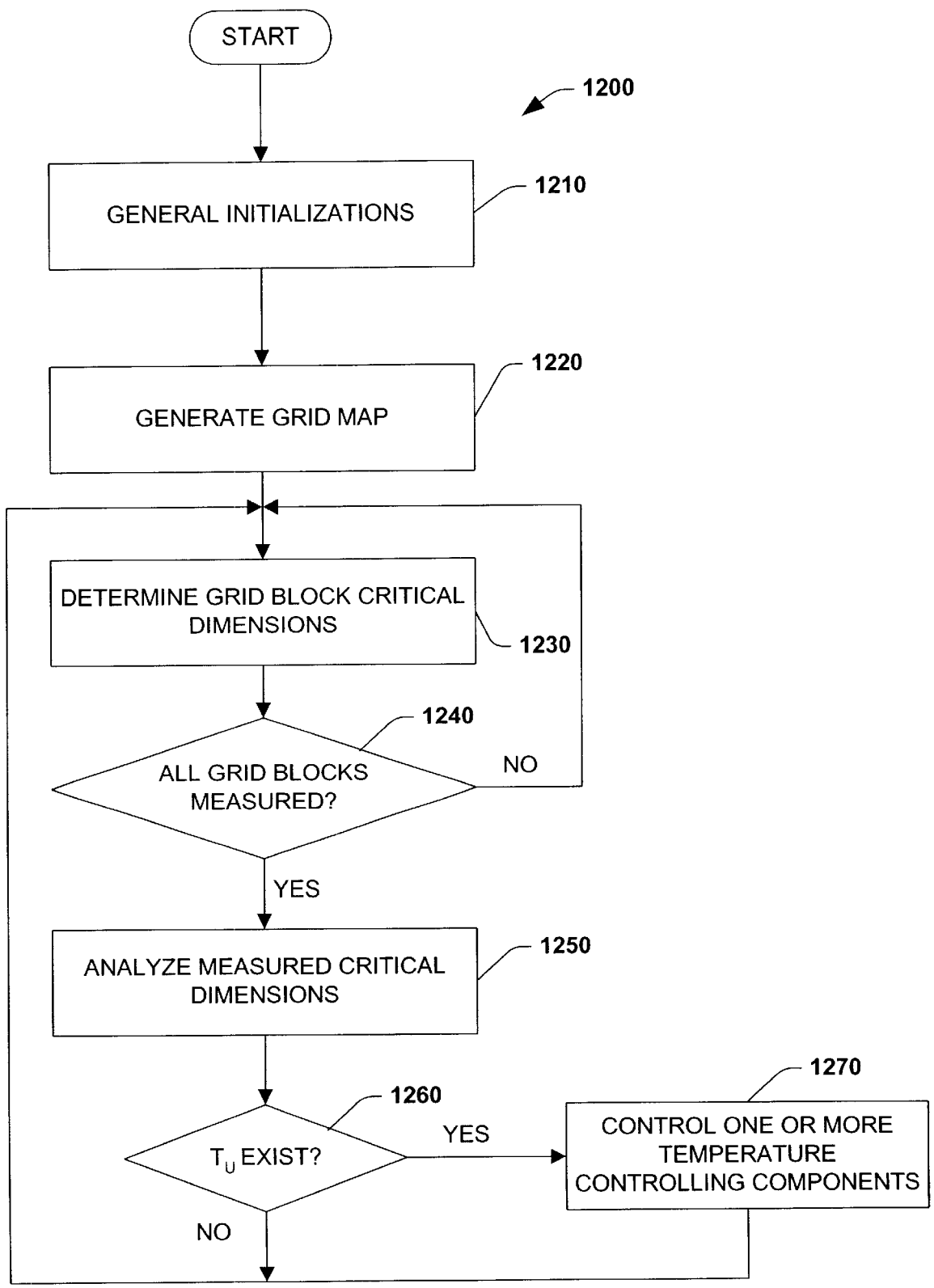
FIG. 10 is a flow diagram illustrating one specific methodology for carrying out the present invention.

In view of the exemplary systems shown and described above, a methodology, which may be implemented in accordance with the present invention, will be better appreciated with reference to the flow diagram of FIG. 10. While, for purposes of simplicity of explanation, the methodology is shown and described as a series of blocks, it is to be understood and appreciated that the present invention is not limited by the order of the blocks, as some blocks may, in accordance with the present invention, occur in different orders and/or concurrently with other blocks from that shown and described herein. Moreover, not all illustrated blocks may be required to implement a methodology in accordance with the present invention.

FIG. 10 is a flow diagram illustrating one particular methodology 1200 for carrying out the present invention. At 1210, general initializations are performed. Such initializations include, but are not limited to, allocating memory, establishing pointers, establishing data communications, acquiring resources, setting variables and displaying process activity. At 1220, at least a portion of a wafer is mapped into a plurality of grid blocks "XY". At 1230, critical dimension measurements are made with respect to the various wafer portions mapped by the respective grid blocks XY. For example, reflected and/or passed through light can be analyzed to facilitate generating one or more signatures. At 1240, a determination is made concerning whether all grid block measurements have been taken. If the determination at 1240 is NO, then processing returns to block 1230. If the determination at block 1240 is YES, then at 1250 measured critical dimensions are processed into values that can be compared against a table of acceptable critical dimensions for the respective portions of the wafer. At 1260, a determination is made concerning whether any critical dimensions are not acceptable. If all critical dimension values are acceptable, then processing returns to block 1230 for another iteration. If unacceptable critical dimension values are found for any of the grid blocks, processing continues at 1270, where the unacceptable critical dimension values are analyzed. After the analyses, feedback information is generated that can be employed to control one or more temperature controlling components operable to affect the temperature at grid blocks with unacceptable critical dimension values. The present iteration is then ended and the process returns to 1230 to perform another iteration.

Scatterometry is a technique for extracting information about a surface upon which an incident light has been directed. Information concerning properties including, but not limited to, dishing, erosion, profile, chemical composition, thickness of thin films and critical dimensions of features present on a surface such as a wafer can be extracted. The information can be extracted by comparing the phase and/or intensity of the light directed onto the surface with phase and/or intensity signals of a complex reflected and/or diffracted light resulting from the incident light reflecting from and/or diffracting through the surface upon which the incident light was directed. The intensity and/or the phase of the reflected and/or diffracted light will change based on properties of the surface upon which the light is directed. Such properties include, but are not limited to, the chemical properties of the surface, the planarity of the surface, features on the surface, voids in the surface, and the number and/or type of layers beneath the surface.

Different combinations of the above-mentioned properties will have different effects on the phase and/or intensity of the incident light resulting in substantially unique intensity/phase signatures in the complex reflected and/or diffracted light. Thus, by examining a signal (signature) library of intensity/phase signatures, a determination can be made concerning the properties of the surface. Such substantially unique phase/intensity signatures are produced by light reflected from and/or refracted by different surfaces due, at least in part, to the complex index of refraction of the surface onto which the light is directed. The complex index of refraction (N) can be computed by examining the index of refraction (n) of the surface and an extinction coefficient (k). One such computation of the complex index of refraction can be described by the equation:

$$N=n-jk$$

where j is an imaginary number.

The signal (signature) library can be constructed from observed intensity/phase signatures and/or signatures generated by modeling and simulation. By way of illustration, when exposed to a first incident light of known intensity, wavelength and phase, a first feature on a wafer can generate a first phase/intensity signature. Similarly, when exposed to the first incident light of known intensity, wavelength and phase, a second feature on a wafer can generate a second phase/intensity signature. For example, a line of a first width may generate a first signature while a line of a second width may generate a second signature. Observed signatures can be combined with simulated and modeled signatures to form the signal (signature) library. Simulation and modeling can be employed to produce signatures against which measured phase/intensity signatures can be matched. In one exemplary aspect of the present invention, simulation, modeling and observed signatures are stored in a signal (signature) library containing over three hundred thousand phase/intensity signatures. Thus, when the phase/intensity signals are received from scatterometry detecting components, the phase/intensity signals can be pattern matched, for example, to the library of signals to determine whether the signals correspond to a stored signature.

Figure 11:
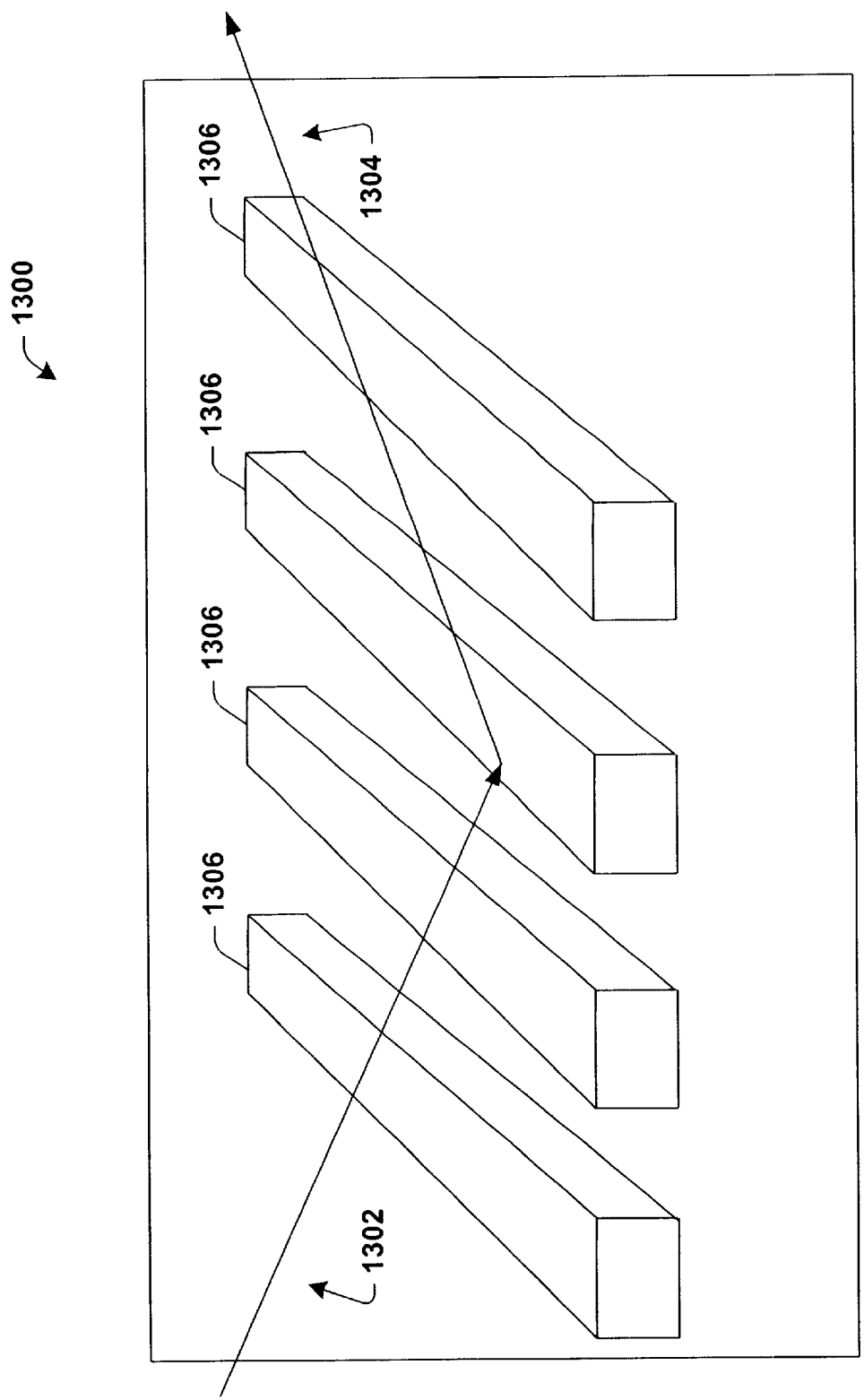
FIG. 11 illustrates an exemplary scatterometry system collecting passed through or transmitted light.

To illustrate the principles described above, reference is now made to FIGS. 11 through 18. Referring initially to FIG. 11, an incident light 1302 is directed at a surface 1300, upon which one or more features 1306 may exist. The incident light 1302 is reflected as reflected light 1304. The properties of the surface 1300, including but not limited to, thickness, uniformity, planarity, chemical composition and the presence of features, can affect the reflected light 1304. The features 1306 are raised upon the surface 1300. The phase and intensity of the reflected light 1304 can be measured and plotted, as shown, for example, in FIG. 16. Such plots can be employed to compare measured signals with signatures stored in a signature library using techniques like pattern matching, for example.

Figure 12:
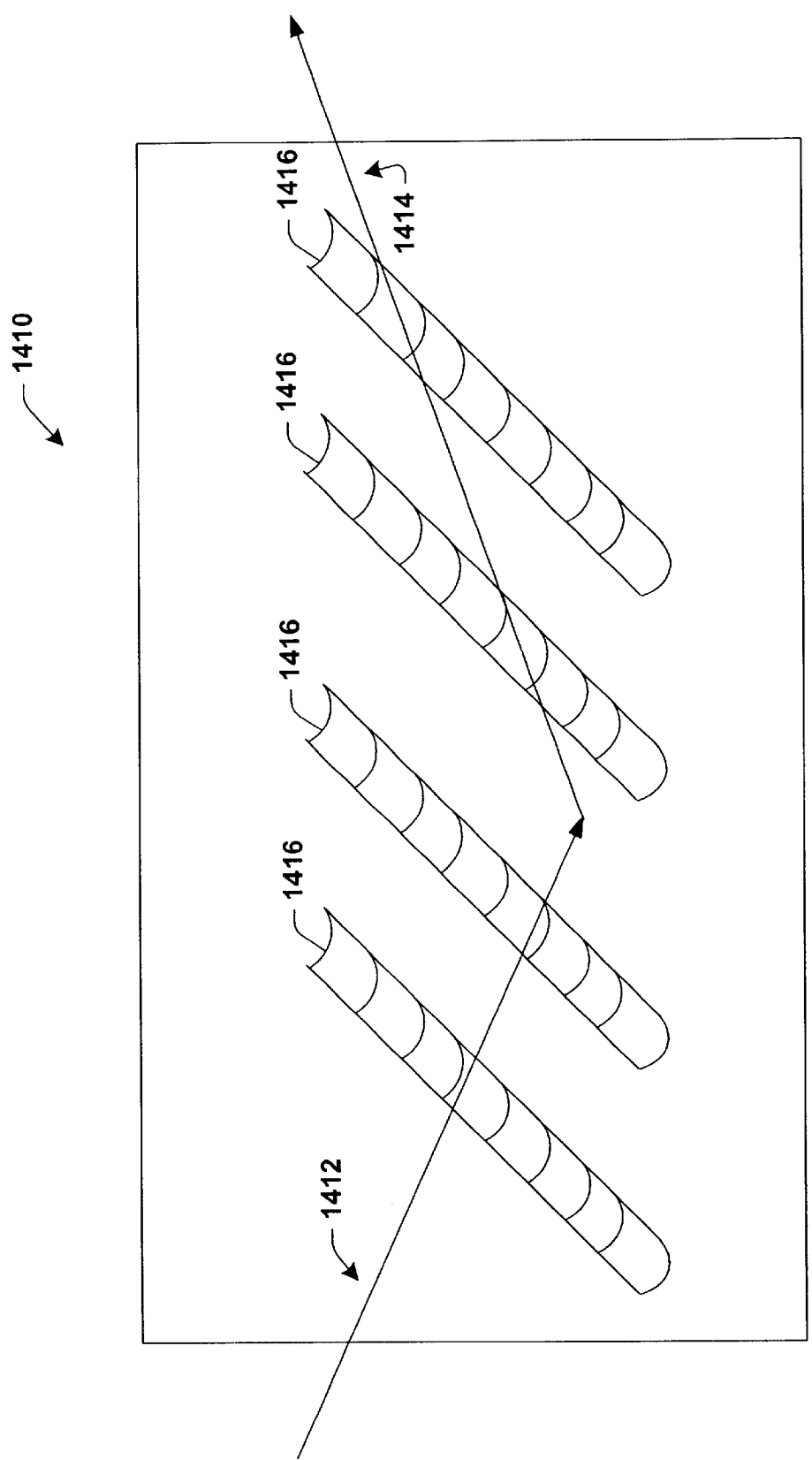
FIG. 12 is a simplified perspective view of an incident light reflecting off a surface, in accordance with an aspect of the present invention.

Referring now to FIG. 12, an incident light 1412 is directed onto a surface 1410 upon which one or more depressions 1416 appear. The incident light 1412 is reflected as reflected light 1414. Like the one or more features 1306 (FIG. 11) may affect an incident beam, so too may the one or more depressions 1416 affect an incident beam. Thus, it is to be appreciated that scatterometry can be employed to measure features appearing on a surface, features appearing in a surface, and properties of a surface itself, regardless of features.

Figure 13:
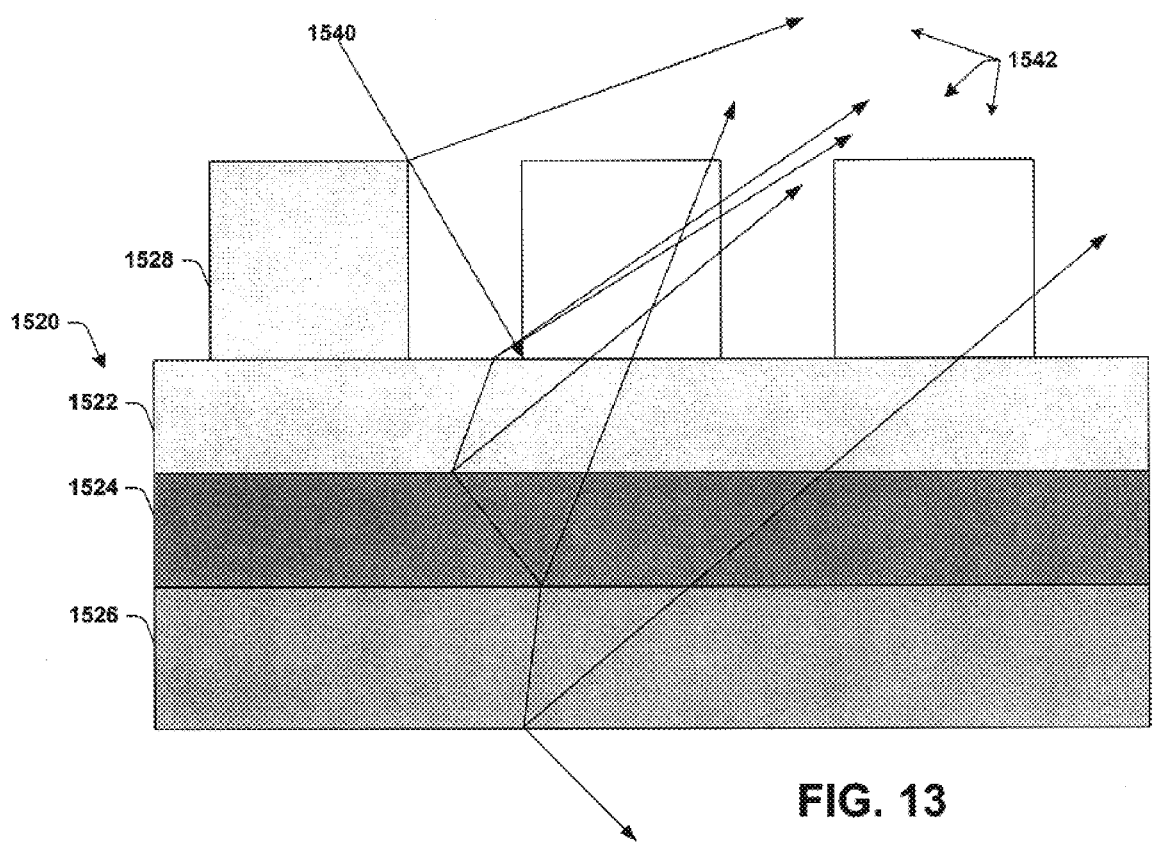
FIG. 13 illustrates a complex reflected and refracted light produced when an incident light is directed onto a surface, in accordance with an aspect of the present invention.

Turning now to FIG. 13, complex reflections and refractions of an incident light 1540 are illustrated. The reflection and refraction of the incident light 1540 can be affected by factors including, but not limited to, the presence of one or more features 1528, and the composition of the substrate 1520 upon which the features 1528 reside. For example, properties of the substrate 1520 including, but not limited to the thickness of a layer 1522, the chemical composition of the layer 1522, the opacity and/or reflectivity of the layer 1522, the thickness of a layer 1524, the chemical composition of the layer 1524, the opacity and/or reflectivity of the layer 1524, the thickness of a layer 1526, the chemical composition of the layer 1526, and the opacity and/or reflectivity of the layer 1526 can affect the reflection and/or refraction of the incident light 1540. Thus, a complex reflected and/or refracted light 1542 may result from the incident light 1540 interacting with the features 1528, and/or the layers 1522, 1524 and 1526. Although three layers 1522, 1524 and 1526 are illustrated, it is to be appreciated that a substrate can be formed of a greater or lesser number of such layers.

Figure 14:
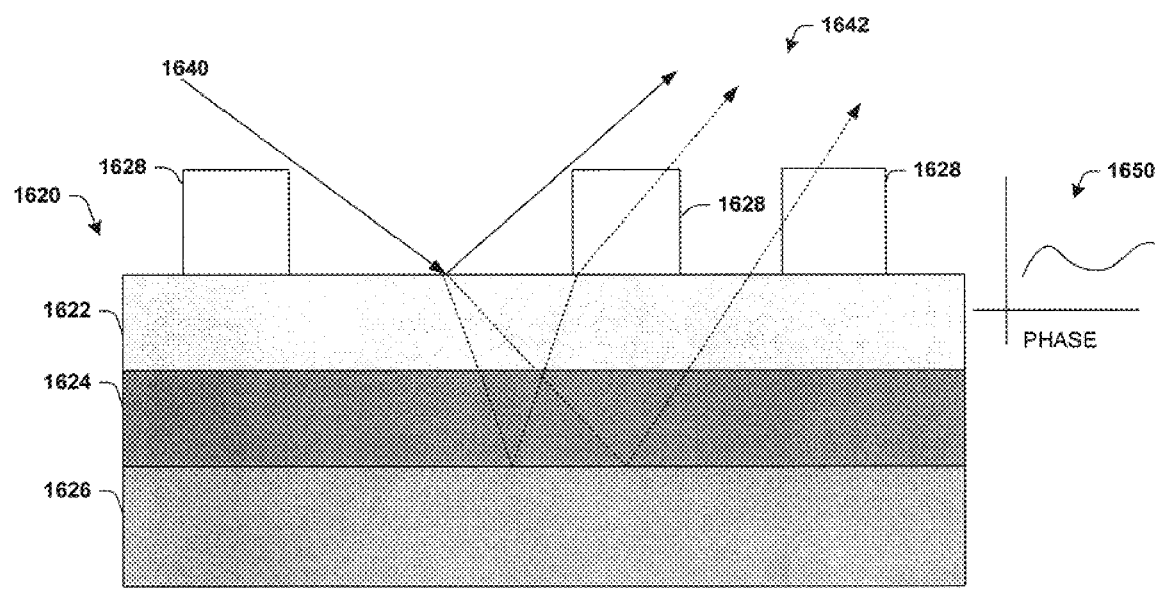
FIG. 14 illustrates a complex reflected and refracted light produced when an incident light is directed onto a surface, in accordance with an aspect of the present invention.
Figure 15:
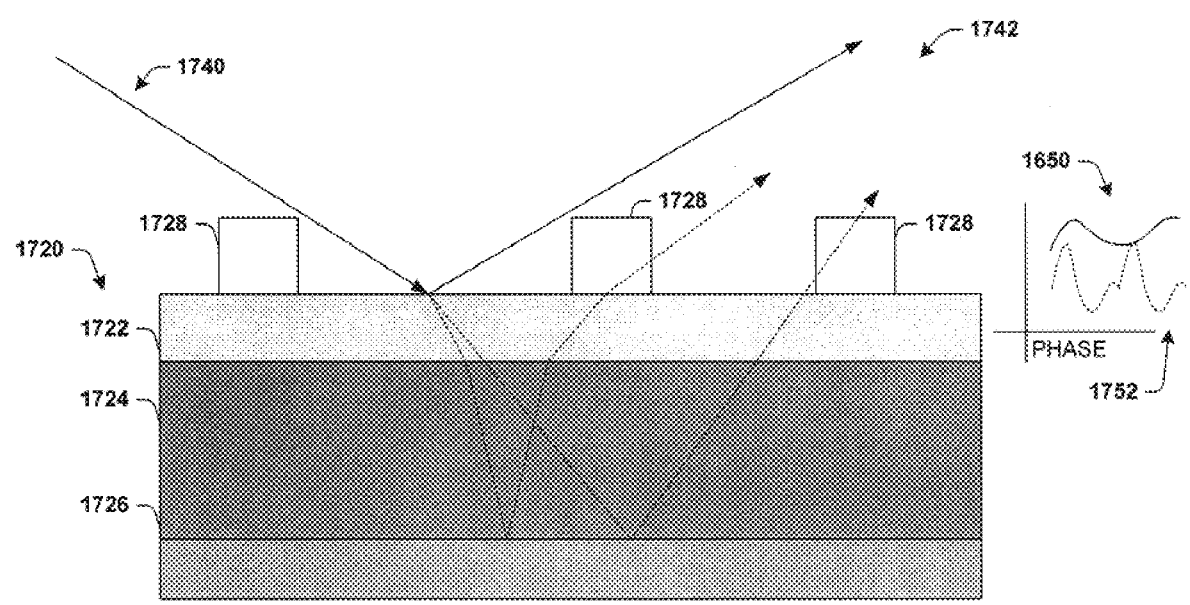
FIG. 15 illustrates a complex reflected and refracted light produced when an incident light is directed onto a surface, in accordance with an aspect of the present invention.
Figure 16:
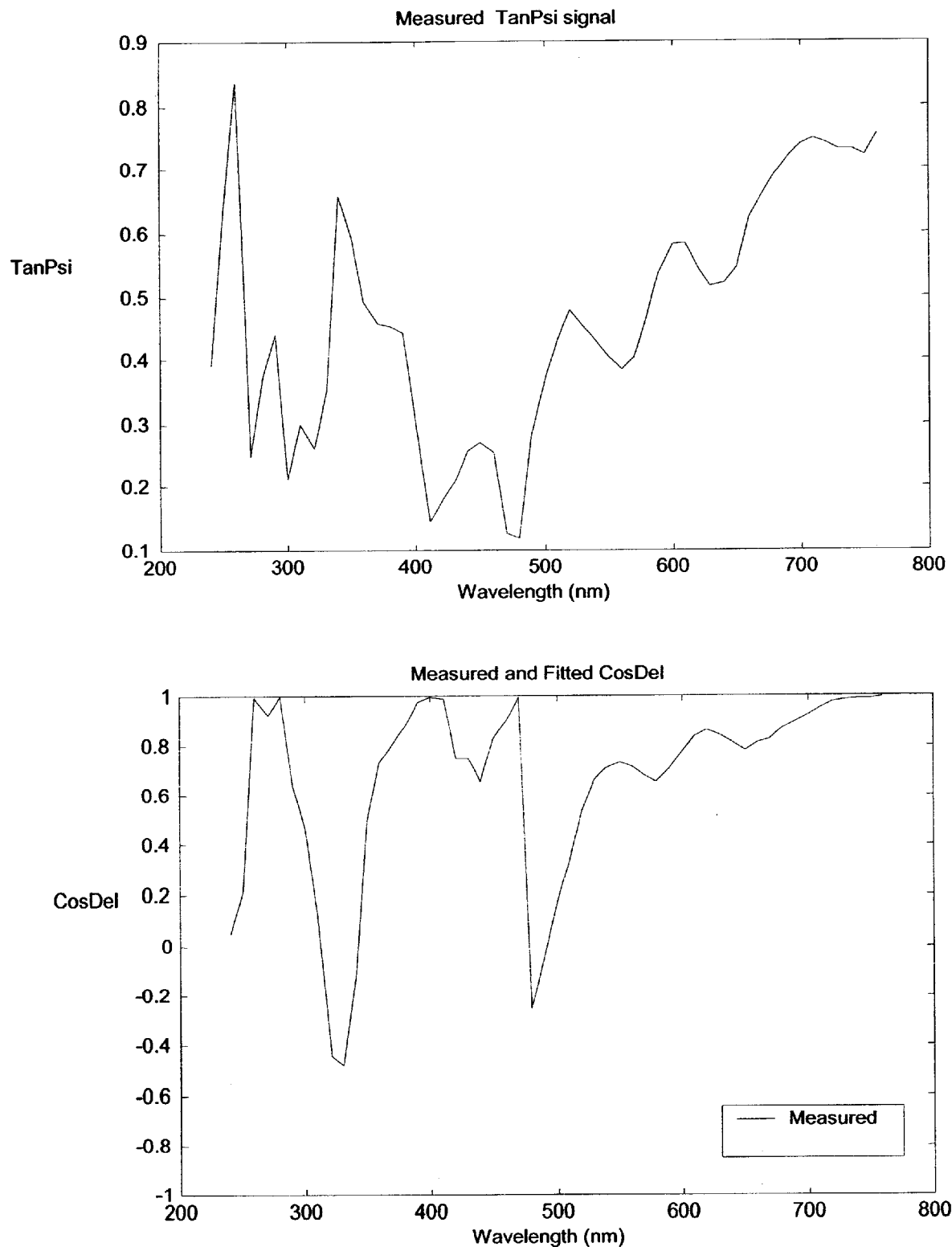
FIG. 16 illustrates phase and intensity signals recorded from a complex reflected and refracted light produced when an incident light is directed onto a surface, in accordance with an aspect of the present invention.

Turning now to FIG. 14, one of the properties from FIG. 15 is illustrated in greater detail. The substrate 1620 can be formed of one or more layers 1622, 1624 and 1626. The phase 1650 of the reflected and/or refracted light 1642 can depend, at least in part, on the thickness of a layer, for example, the layer 1624. Thus, in FIG. 15, the phase 1752 of a reflected light 1742 differs from the phase 1650 due, at least in part, to the different thickness of the layer 1724 in FIG. 15 from the thickness of the layer 1624 in FIG. 14.

Thus, scatterometry is a technique that can be employed to extract information about a surface upon which an incident light has been directed. The information can be extracted by analyzing phase and/or intensity signals of a complex reflected and/or diffracted light. The intensity and/or the phase of the reflected and/or diffracted light will change based on properties of the surface upon which the light is directed, resulting in substantially unique signatures that can be analyzed to determine one or more properties of the surface upon which the incident light was directed.

The present invention provides for a system and method for regulating development time. As a result, the present invention facilitates improving development integrity and reliability, which in turn increases quality of image transfer in lithographic processes in accordance with the present invention.

What has been described above includes examples of the present invention. It is, of course, not possible to describe every conceivable combination of components or methodologies for purposes of describing the present invention, but one of ordinary skill in the art may recognize that many further combinations and permutations of the present invention are possible. Accordingly, the present invention is intended to embrace all such alterations, modifications and variations that fall within the spirit and scope of the appended claims. Furthermore, to the extent that the term "includes" is used in either the detailed description or the claims, such term is intended to be inclusive in a manner similar to the term "comprising" as "comprising" is interpreted when employed as a transitional word in a claim.

What is claimed is:

1. A system for regulating post exposure baking time and temperature, comprising:

at least one temperature controlling component operative to control the temperature of at least one portion of a wafer;

a temperature controlling component driving system for driving the at least one temperature controlling component;

a system for directing light to the at least one portion of the wafer;

a measuring system for measuring critical dimensions based on light reflected from the one or more gratings on the wafer; and a processor operatively coupled to the measuring system and the temperature controlling component driving system, the processor receiving critical dimension data from the measuring system and the processor using the data to at least partially base control of the at least one temperature controlling component so as to regulate the temperature of the at least one portion of the wafer.

2. The system of claim 1, wherein the temperature controlling component is at least one of a heat lamp, a heating coil, a chiller and a fluid conducting apparatus.

3. The system of claim 1, the measuring system further including a scatterometry system for processing the light reflected from the one or more gratings.

4. The system of claim 1, further comprising a measuring system for measuring critical dimensions based on light passing through the one or more gratings.

5. The system of claim 4, the measuring system further including a scatterometry system for processing the light passing through the one or more gratings.

6. The system of claim 3, the processor being operatively coupled to the scatterometry system, the processor analyzing data relating to critical dimensions received from the scatterometry system, and the processor basing control of the at least one temperature controlling component at least partially on the analyzed data.

7. The system of claim 5, the processor being operatively coupled to the scatterometry system, the processor analyzing data relating to critical dimensions received from the scatterometry system, and the processor basing control of the at least one temperature controlling component at least partially on the analyzed data.

8. The system of claim 6, the processor mapping the wafer into one or more grid blocks, and making a determination of the effects of post-exposure baking at the one or more grid blocks.

9. The system of claim 8, wherein the processor determines the existence of an unacceptable effect of post-exposure baking in one or more grid blocks based upon the determined critical dimensions differing from an acceptable value.

10. The system of claim 9, wherein the processor controls the at least one temperature-controlling component to regulate the post-exposure baking temperature of one or more grid blocks.

11. The system of claim 9, wherein the processor controls post-exposure baking time.

* * * * *